United States Patent
Filippo et al.

(10) Patent No.: US 8,232,902 B2
(45) Date of Patent: Jul. 31, 2012

(54) PULSE MODULATION DEVICES AND METHODS

(75) Inventors: Roberto Filippo, Beinasco (IT); Diego Gaetano Munari, Valdagno (IT); Federico Tosato, Pernumia (IT); Andrea Logiudice, Padua (IT)

(73) Assignee: Infineon Technologies AG, Neubiberg (DE)

( * ) Notice: Subject to any disclaimer, the term of this patent is extended or adjusted under 35 U.S.C. 154(b) by 111 days.

(21) Appl. No.: 12/790,352

(22) Filed: May 28, 2010

(65) Prior Publication Data

US 2011/0291584 A1  Dec. 1, 2011

(51) Int. Cl.
*H03M 5/22* (2006.01)
(52) U.S. Cl. .......................... 341/54; 375/238
(58) Field of Classification Search ................ 341/54; 375/238, 22; 327/172; 363/21, 49; 323/224, 323/271
See application file for complete search history.

(56) References Cited

U.S. PATENT DOCUMENTS

| | | | |
|---|---|---|---|
| 4,660,162 A | | 4/1987 | Berlinsky |
| 5,311,548 A | * | 5/1994 | Nikolaus ................ 375/238 |
| 6,586,890 B2 | | 7/2003 | Min et al. |
| 7,176,948 B2 | | 2/2007 | Lewis |
| 7,321,203 B2 | | 1/2008 | Marosek |
| 2002/0101198 A1 | | 8/2002 | Kemp |
| 2007/0064007 A1 | | 3/2007 | Childers et al. |
| 2010/0231132 A1 | | 9/2010 | Logiudice et al. |

OTHER PUBLICATIONS

Barr, M., "Introduction to Pulse Width Modulation (PMW)" Embedded Systems Programming, Sep. 2001, pp. 103-104.
Gulati, A., "Modulation Techniques for LED Dimming," PSoC Designer™ 4.4, Oct. 22, 2008, Document No. 001-49262, AN49262, pp. 1-10.

* cited by examiner

*Primary Examiner* — Joseph Lauture
(74) *Attorney, Agent, or Firm* — Slater & Matsil, L.L.P.

(57) ABSTRACT

An embodiment method of generating an output pulse stream comprises first pulse modulating a first multi-bit input term to generate a first one-bit pulse stream, using a bitwise logic AND to combine the first one-bit pulse stream and a second multi-bit term, thereby generating a multi-bit AND output, and second pulse modulating the multi-bit AND output to generate a one-bit output pulse stream representing a product of the first and second multi-bit input terms.

20 Claims, 14 Drawing Sheets

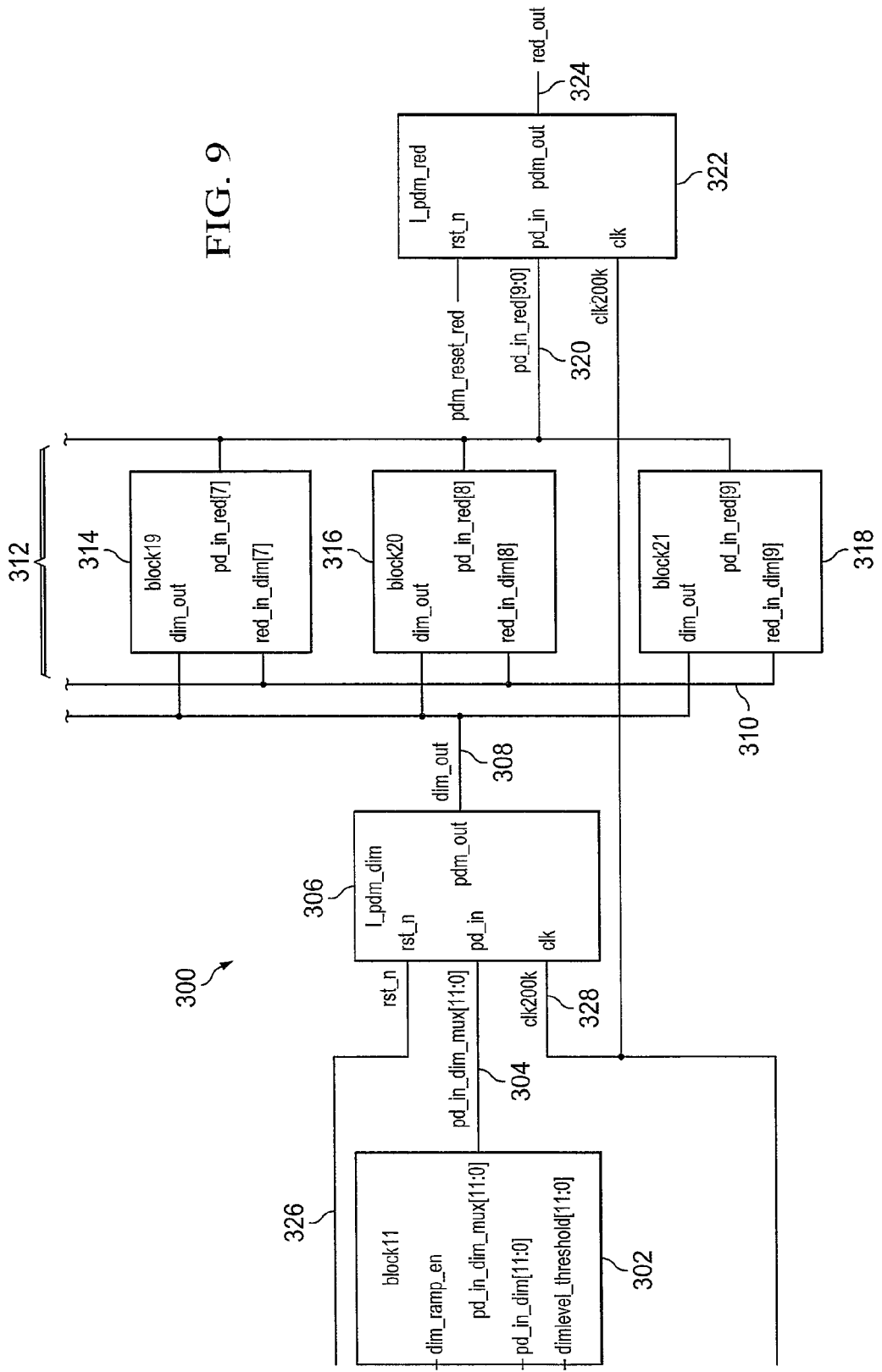

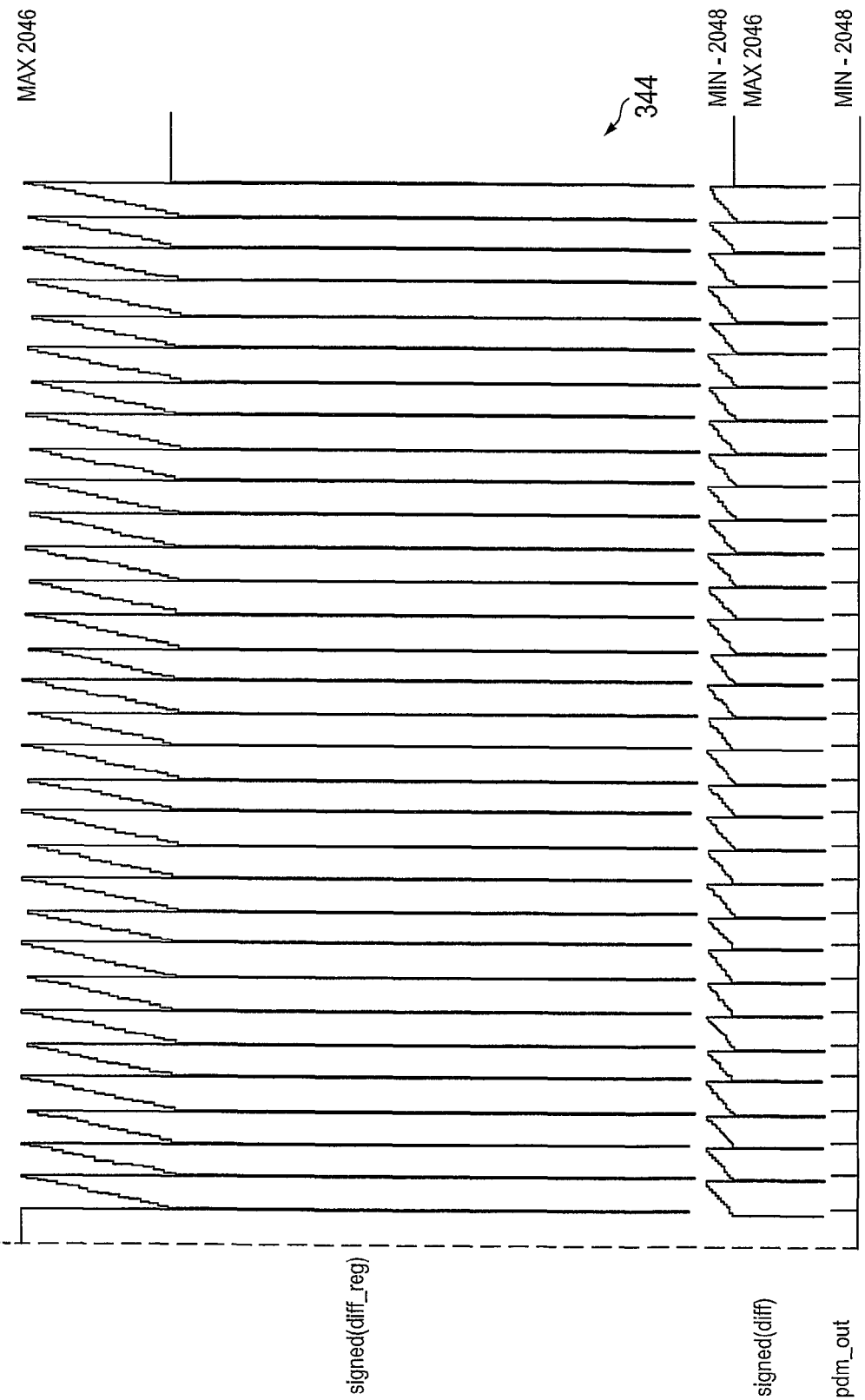

PULSE MODULATION DEVICES AND METHODS

TECHNICAL FIELD

The present invention relates generally to electrical signal control devices and methods, and more particularly to pulse modulation devices and methods.

BACKGROUND

Generally, many types of electrical devices may utilize analog signals that are continuously-variable, and effectively infinite in resolution in time and magnitude. For example, actuators and transducers, such as light emitting diodes ("LED"s), motors, robotic servos, heating elements, light dimmers, braking systems, and the like, receive analog input control signals to control their operation. That is, an input control signal may control the brightness of an LED or other type of lighting device, the speed of a motor, the heat output of a heating element, etc.

Generally, these types of devices alternatively may be controlled by digital controllers, such as microprocessors, digital signal processors, and microcontrollers, that generate a digitally-encoded version of an analog control signal. Devices such as switching amplifiers (e.g., for use in audio) and switched mode power supplies (e.g., for use in computers) also may utilize such digital control signals.

Generally a digital controller may modulate a digital signal through the use of pulse modulation to generate a digitally-encoded control signal representative of an analog signal. Pulse modulation modifies a parameter of a series of digital pulses in order to encode an analog signal level. By operating at a pulse frequency sufficiently above that which would or appear at have an adverse effect on the load, pulse modulation provides a digital signal appearing to the load as a steady voltage between the low and high values used for the load.

Several different types of modulation have been developed, including pulse amplitude modulation, pulse density modulation, and pulse width modulation. Pulse amplitude modulation generally modifies the amplitude of individual pulses to simulate voltages between a low level and a high level. Pulse density modulation generally modifies the density of the pulses in a pulse stream to represent different signal levels. Pulse width modulation generally modifies the duty cycle, or percentage of time that the signal is on, of a series of pulses by changing the pulse width, or duration of on-time, of individual pulses. Generally, pulse width modulation may be considered a special case of pulse density modulation in which all the pulses corresponding to one sample are contiguous in the digital signal.

SUMMARY OF THE INVENTION

These and other problems are generally solved or circumvented, and technical advantages are generally achieved, by embodiments of the present invention which generate a pulse modulation stream of the product of two factors. Other embodiments of the present invention provide a discontinuity filler for a pulse modulation stream.

In accordance with an embodiment of the present invention, a pulse stream generator comprises a first pulse modulator having a first multi-bit teen input, and having a first one-bit pulse stream output, a logic AND block having a first input coupled to the first one-bit pulse stream output of the first modulator, having a second multi-bit term input, and having a multi-bit AND output, and a second pulse modulator having an input coupled to the multi-bit AND output, and having a second one-bit output pulse stream output representing a product of the first and second multi-bit term inputs.

In accordance with another embodiment of the present invention a method of generating an output pulse stream comprises first pulse modulating a first multi-bit input term to generate a first one-bit pulse stream, using a bitwise logic AND to combine the first one-bit pulse stream and a second multi-bit term, thereby generating a multi-bit AND output, and second pulse modulating the multi-bit AND output to generate a one-bit output pulse stream representing a product of the first and second multi-bit input terms.

In accordance with another embodiment of the present invention, a pulse stream generator comprises a pulse modulator having a first multi-bit input and having a first one-bit pulse stream output, a logic OR coupled to the pulse modulator, and a discontinuity filler having a count reset input coupled to the first one-bit pulse stream output of the pulse modulator, and having a filler output coupled to a first input of the logic OR.

In accordance with another embodiment of the present invention, a method of generating an output pulse stream comprises pulse modulating a first multi-bit input to generate a first one-bit pulse stream, monitoring the first one-bit pulse stream for idle periods, and if an idle period is detected to be equal to or greater than a discontinuity threshold, injecting a filler output into a one-bit output pulse stream.

BRIEF DESCRIPTION OF THE DRAWINGS

For a more complete understanding of the present invention, and the advantages thereof, reference is now made to the following descriptions taken in conjunction with the accompanying drawings, in which:

FIG. 9 is a schematic of a portion of a pulse stream generator having two of the pulse density modulators of FIG. 8;

FIGS. 14A and 14B are a timing diagram showing an expanded view of a portion of the timing diagram of FIG. 13;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a pulse modulator controlling the intensity of an LED. The invention also may be applied, however, to other applications in which a pulse modulation stream is used to control an actuator or transducer, such as other lighting elements, motors, servos, heating elements, braking systems, and the like.

Figure 1:
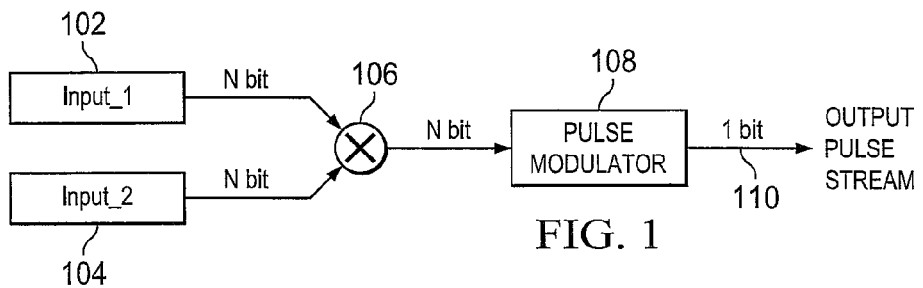
FIG. 1 is a block diagram of a pulse modulator generating a pulse stream from the product of two terms.

The pulse modulation of the product between two factors may be done in multiple ways. In one approach, illustrated in FIG. 1, two factors, Input_1 102 and Input_2 104, are multiplied using arithmetic multiplier 106 in a first stage. Quantization of the multiplier output product may be performed with a quantizer to map a large set of possible discrete values to a relatively smaller set of discrete values. The result is modulated with pulse modulator 108 in a second stage to generate output pulse stream 110. One disadvantage of this approach is the high cost in terms of circuit real estate area or in terms of number of digital components. In addition, the output may not represent the input sufficiently accurately because of the quantization.

Figure 2:
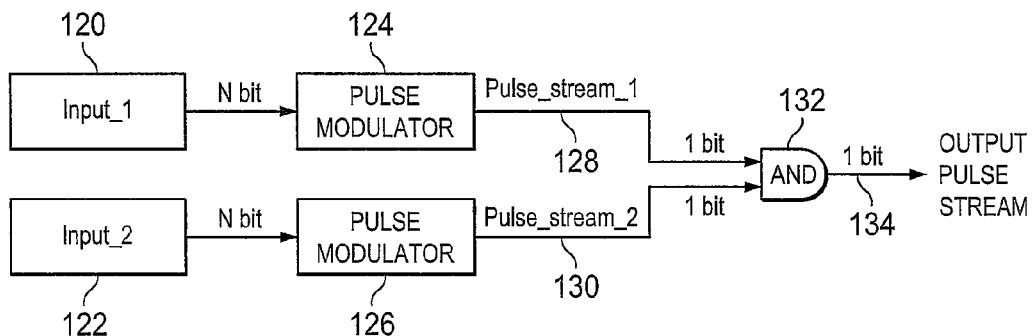
FIG. 2 is a block diagram of a logic AND combining the outputs of two pulse modulators.

In another approach, illustrated in FIG. 2, each of the two input factors, Input_1 120 and Input_2 122, is operated on by a pulse modulator in a first stage. Pulse modulator 124 generates Pulse_stream_1 128 representing input factor Input_1 120, and pulse modulator 126 generates Pulse_stream_2 130 representing input factor Input_2 122. AND block 128 performs a logic AND between the two output pulse streams to generate the output pulse stream 134. As with the first approach, one disadvantage of this second approach is that the output may not represent the input sufficiently accurately. This approach also may exhibit synchronization problems between the streams, causing glitches to occur.

Figure 3:
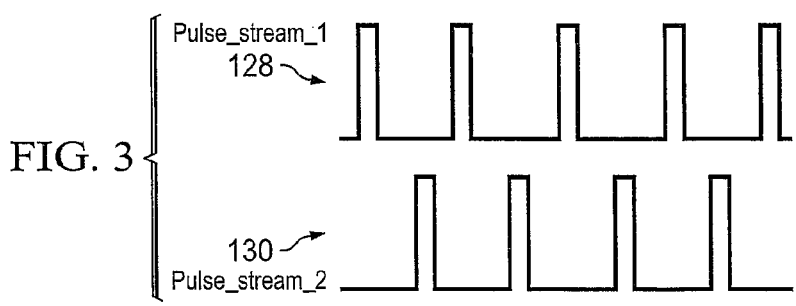
FIG. 3 is a timing diagram of the outputs of the two pulse modulators of FIG. 2 when the outputs are not overlapping.

For example, it may be that for particular combinations of the input factors, the output pulse stream generally is '0'. As shown in FIG. 3, when Input_1 120 and Input_2 122 are periodic signals but offset from each other, thus generating Pulse_stream_1 128 and Pulse_stream_2 130 that are offset from each other as well. Thus it may occur that the result of the logic AND of these two streams, output pulse stream 134, may generally always be '0', although the true product of Input_1*Input_2 isn't '0'. Other similar cases may provide a pulse stream that represents wrong information. In all of these cases, detectable tones are generated.

Figure 4:
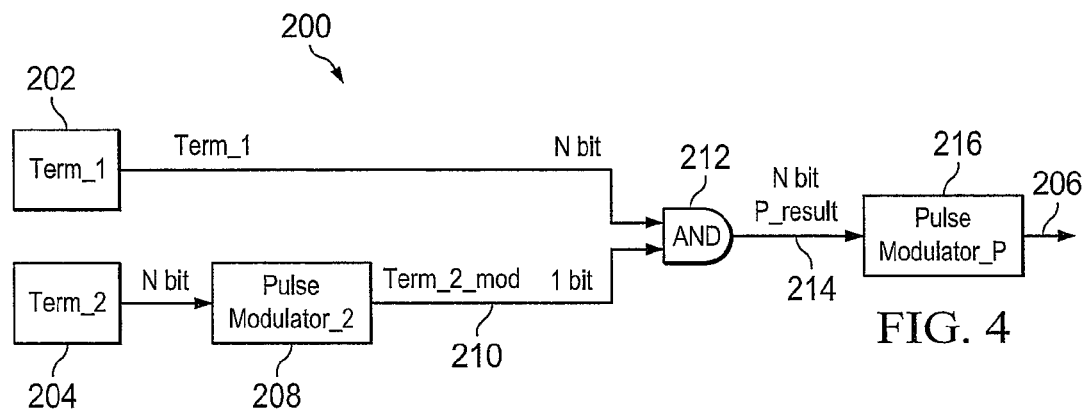
FIG. 4 is a block diagram of a pulse stream generator having two pulse modulators.

FIG. 4 illustrates a pulse stream generator 200 that provides pulse modulation of the arithmetic product between two factors for various combinations of pulse modulators. For example, with Pulse Width Modulation, the output duty cycle is the product of the two input duty cycles: Duty_Cycle_Out=Duty_Cycle_1*Duty_Cycle_2. As another example, with Pulse Density Modulation, the output pulse density is the product of the two input pulse densities: Pulse_Density_Out=Pulse_Density_1*Pulse_Density_2. In a combination pulse modulator example having both pulse density modulation and pulse width modulation, the output pulse density is the product of the pulse density of one input and the duty cycle of the other input: Pulse_Density_Out=Pulse_Density_1*Duty_Cycle_2.

Pulse stream generator 200 has two input terms Term_1 202 and Term_2 204 that are multiplied and converted into an output pulse stream 206. One of the terms of the multiplication, Term_2 204, is converted into 1-bit pulse stream Term_2_mod 210 by a first pulse modulator 208. This pulse modulator may be a pulse width modulator ("PWM"), a pulse density modulator ("PDM"), and the like.

Multiplication of 1-bit Term_2 204 and N-bit Term_1 202 is performed by AND logic block 212 to generate output P_result 214. For this and the other embodiments described herein, the value of N for multi-bit signals may be dependent on the specific application. For example, the value of N may be 4, 8, 12, 16, 24, 32, 48, 64, and the like. The N-bit output of the logic AND is then input to a second pulse modulator 216 that converts P_result 214 into the output pulse stream 206. This pulse modulator also may be a pulse width modulator, a pulse density modulator, and the like. The output of the second pulse modulator 216 thus represents the product between the two starting factors, Term_1 202 and Term_2 204, in the chosen modulation scheme.

Figure 5:
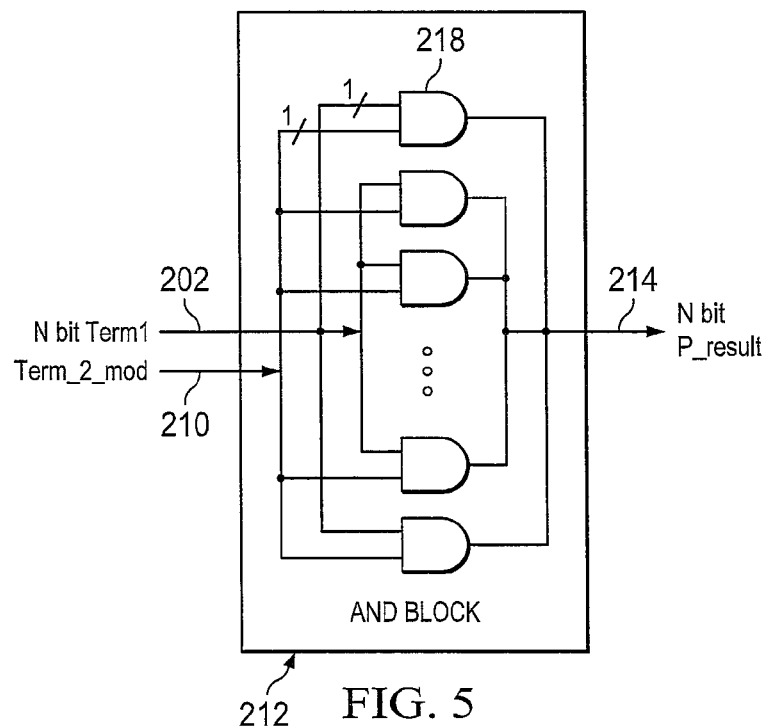
FIG. 5 is a block diagram of the logic AND block of FIG. 4.

FIG. 5 illustrates an implementation of bitwise AND block 212. AND block 212 receives as inputs the N-bit Term_1 202 and 1-bit pulse stream Term_2_mod 210. AND block 212 performs a bitwise AND 218 of Term_2_mod 210 with each bit of N-bit Term_1 202, producing the N-bit product P_result 214. Operation of AND block 212 is illustrated in the timing diagram of FIG. 6, which shows the timing relationship between input pulse stream Term_2_mod 210 and output product P_result 214.

In some embodiments, pulse stream generator 200 provides simplicity over prior art approaches. For example, pulse stream generator 200 generally may be implemented using only basic digital blocks. A single source clock may be utilized for all of the blocks of pulse stream generator 200. In some embodiments, pulse stream generator 200 provides an output that exactly represents the product value of the two input factors. Furthermore, pulse stream generator 200 generally does not produce glitches, or experience other types of synchronization problems.

Figure 7:
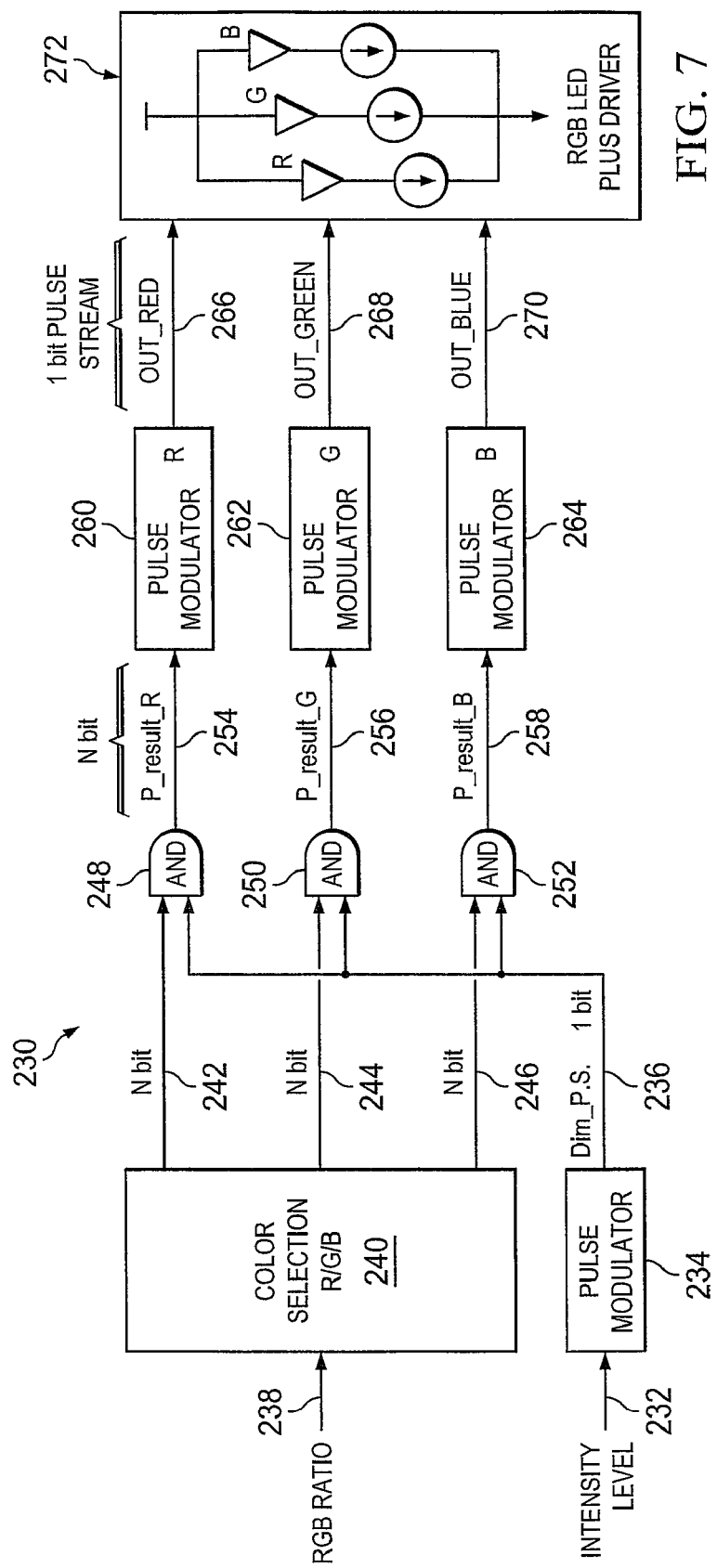
FIG. 7 is a block diagram of an LED control system having three pulse stream generators for the red, green and blue color channels.

As discussed above, pulse stream generation based on the product of two input factors may have a variety of applications. For example, this type of multiplication may be used in lighting applications, such as in the control of a red-green-blue ("RGB") LED when the color and the light intensity are independently selected as different input terms. FIG. 7 illustrates the use of three pulse stream generators to control an RGB LED. In LED control system 230, one input term is the color intensity and the other input term is the dimming value, which provide control of the color and intensity level the RGB LED.

Intensity level 232 is the first input to LED control system 230, and selects the light intensity of RGB LED 272. Intensity level 232 is input to first pulse modulator 234, which generates 1-bit pulse stream Dim_pulse_stream 236. This pulse modulator may be a pulse width modulator, a pulse density modulator, and the like. This portion of the pulse stream generator is shared between all three pulse stream generators, each of which controls one of the three color channels, red, green and blue. RGB ratio 238 is the other input to LED control system 230, and selects the color intensity to be displayed by RGB LED 272. Using RGB ratio 238 as input, color selection unit 240 generates three N-bit signals, red input 242, green input 244 and blue input 246, each of which represents the color intensity for the respective color, red, green and blue.

Multiplication is performed by AND blocks 248, 250 and 252. N-bit red input 242 and 1-bit dim_pulse_stream 236 are input to a red AND block 248 to generate the N-bit product P_result_R 254 for the red channel. Likewise N-bit green input 244 and 1-bit dim_pulse_stream 236 are input to a green AND block 250 to generate the N-bit product P_result_G 256 for the green channel. Similarly, N-bit blue input 246 and 1-bit dim_pulse_stream 236 are input to a blue AND block 252 to generate the N-bit product P_result_B 258 for the blue channel.

Each of the three signals is then input to a second stage pulse modulator. Red pulse modulator 260 converts N-bit P_result_R 254 into 1-bit output pulse stream, OUT_RED 266. Green pulse modulator 262 converts N-bit P_result_G 256 into 1-bit output pulse stream, OUT_GREEN 268. Lastly, blue pulse modulator 264 converts N-bit P_result_B 258 into 1-bit output pulse stream, OUT_BLUE 270. These pulse modulators may be pulse width modulators, pulse density modulators, and the like. The three 1-bit pulse streams, OUT_RED 266, OUT_GREEN 268 and OUT_BLUE 270 are then used to control the color and light intensity of RGB LED 272.

The LED control system 230 thus enables the selecting of a color (RGB ratio) and an intensity level for an RGB LED, and provides three output pulse streams, one for each channel, red, green and blue. As an example, if pulse density modulators are used, the final pulse density of each channel corresponds to the product between the color pulse density (R/G/B) and the intensity level pulse density. The blocks or functions of the embodiments discussed above (as well as below) may be implemented in hardware, software, firmware, or a combination thereof. That is, the functions may be implemented in the software or firmware of a microprocessor, digital signal processor or microcontroller. When implemented in software or firmware, inputs and outputs of the various elements of the embodiments may be the inputs and outputs of software/firmware code, routines or steps. Alternatively, the embodiments may be implemented in digital logic, either with discrete components or with one or more integrated circuits. Alternatively, the embodiments described herein may be implemented separate from or together with the device being controlled by the output pulse stream. Furthermore, any combination of the above alternatives may be used to implement the embodiments disclosed herein.

Figure 8:
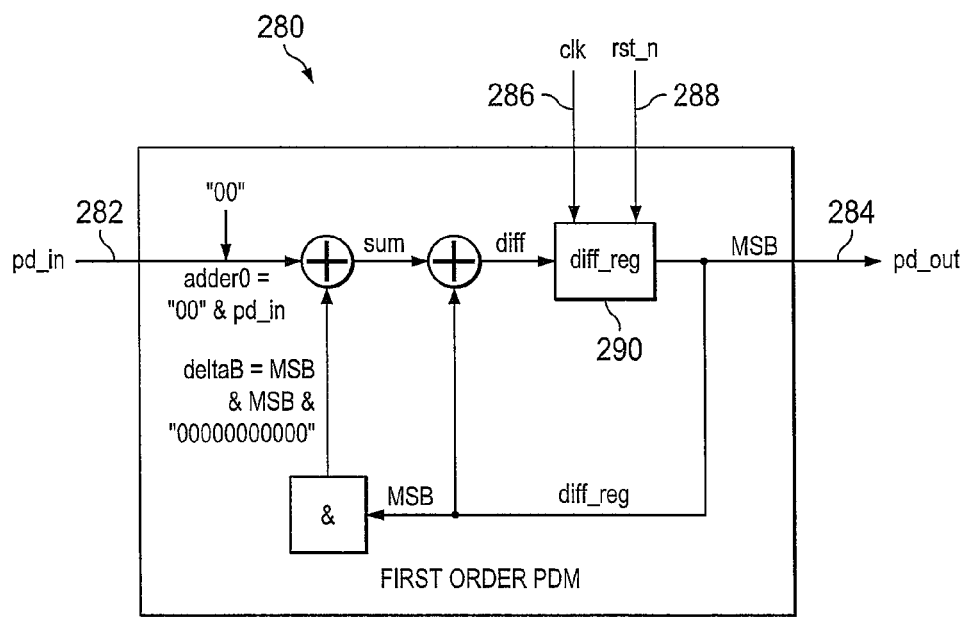
FIG. 8 is a block diagram of a $1^{st}$ order delta-sigma pulse density modulator.

Continuing with the LED control embodiment, FIG. 8 illustrates an implementation of a pulse density modulator, two of which are used in the red channel pulse stream generator schematic shown in FIG. 9. Specifically, FIG. 8 illustrates a 10-bit first order delta-sigma pulse density modulator 280. The delta-sigma modulator alternatively may be of higher order than first order, such as $2^{nd}$ order, $3^{rd}$ order, $4^{th}$ order, or higher. Pulse density modulator 280 essentially functions as a one-bit quantizer that produces a 1-bit output bit stream pd_out 284 from N-bit input pd_in 282. Pulse density modulator also receives clock signal 286 and reset signal 288. Integrator diff_reg 290 integrates N-bit input pd_in 282 to provide the summing or sigma function. The output of integrator diff_reg 290 is negatively fed back in the delta-sigma process loop as an error signal to be differenced from the input in order to average out quantization error.

FIG. 9 illustrates a schematic of a portion of a red channel pulse stream generator 300. The schematic includes signal names that are referenced for illustrating the operation of the pulse stream generator 300 in subsequent timing charts. In FIG. 9, two delta-sigma pulse density modulators similar to that shown in 280 of FIG. 8 are used in the red channel pulse stream generator 300. Dimming level generator 302 generates 12-bit dimming level signal 304, which selects the light intensity of the RGB LED, as the first factor of the multiplication product. Dimming level signal 304 is input to first delta-sigma pulse density modulator 306, which generates 1-bit pulse stream dim_out 308. Ten bit signal red_in_dim(9:0) 310 is the other multiplicand of the multiplication product, and selects the red color intensity to be displayed by the LED.

Multiplication is performed by AND block 312, only some of which bits are shown in FIG. 9. Signal red_in_dim(9:0) 310 and 1-bit dim_out 308 are input to AND block 312 to generate the 10-bit product pd_in_red(9:0) 320 for the red channel. Each bit red_in_dim(n) of the color intensity signal 310 is AND'd with the dimming level bit stream dim_out 308. AND functions 314, 316 and 318 operate on bits red_in_dim(7), red_in_dim(8) and red_in_dim(9), respectively.

The 10-bit signal pd_in_red(9:0) is then input to second delta-sigma pulse density modulator 322. Second pulse density modulator 322 converts 10-bit pd_in_red(9:0) into 1-bit output pulse stream, red_out 324. The 1-bit pulse stream, red_out 324 then is used to control the red color intensity and light intensity of the LED. Various blocks or functions of pulse generator 300 also receive reset signal rst_n 326 and clock signal clk 328.

Figure 10:
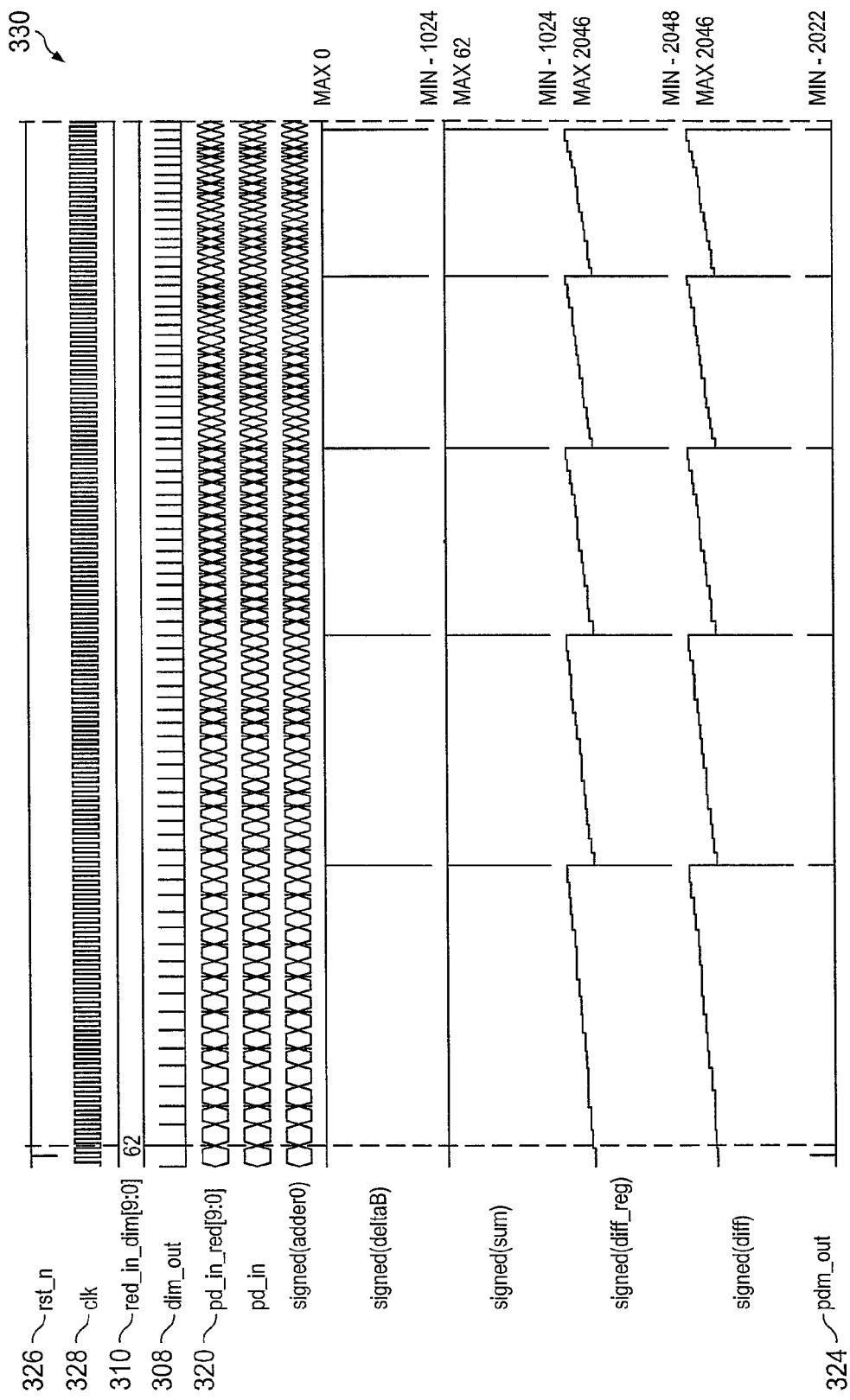
FIG. 10 is a timing diagram showing the operation of the pulse stream generator of FIG. 9.
Figure 11:
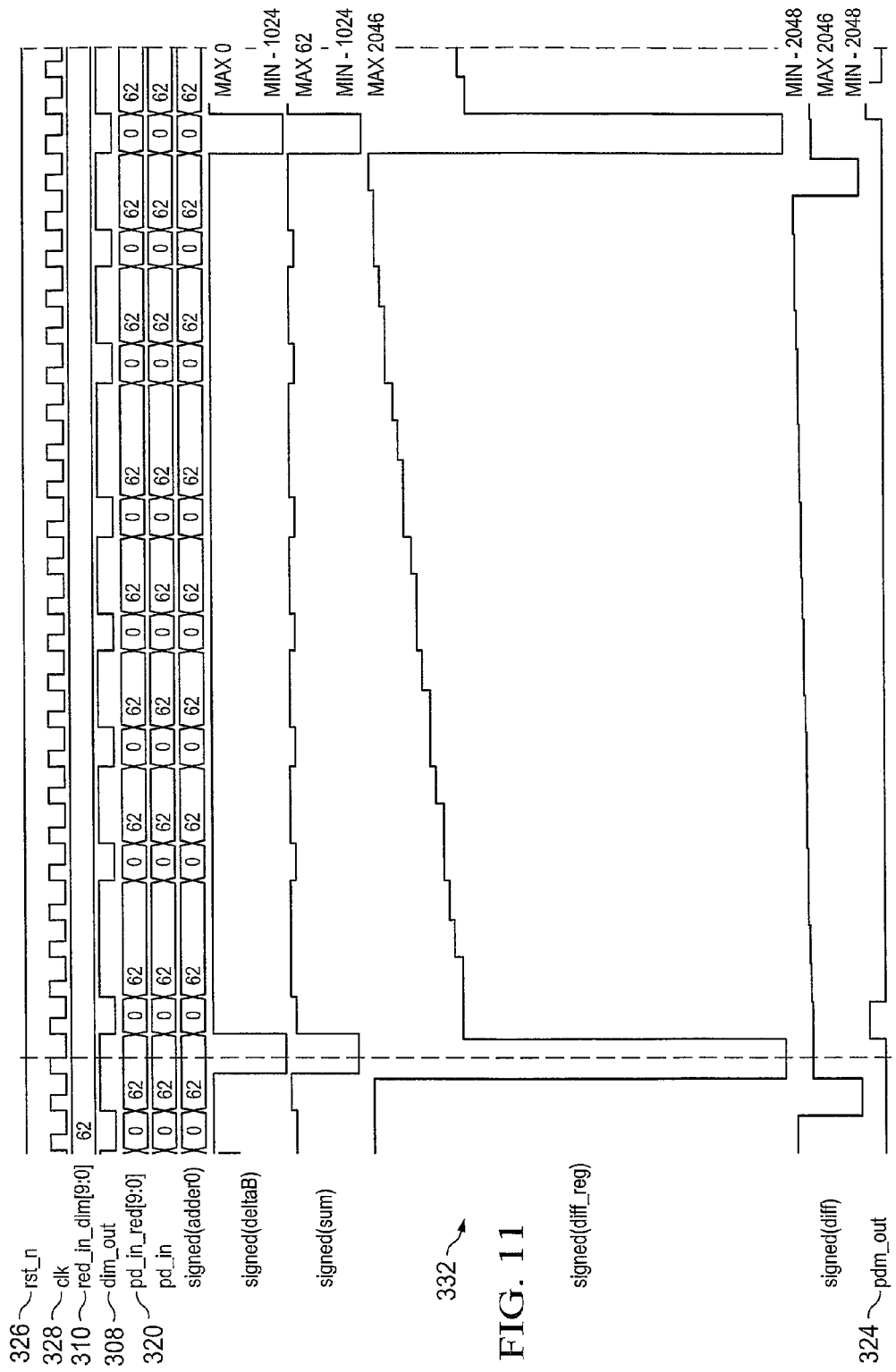
FIG. 11 is a timing diagram showing an expanded view of a portion of the timing diagram of FIG. 10.

FIG. 10 is a timing chart 330 of the pulse stream generator 300 having two delta-sigma pulse density modulators 306 and 322, and FIG. 11 is an expanded timing chart 332 of a portion of the timing chart 330 shown in FIG. 10. FIG. 11 essentially shows one integration interval or cycle of the delta-sigma pulse density modulators. As can be seen in FIGS. 10 and 11, the density of the output of the second pulse density modulator, red_out 324, bound to the slope of the integrator diff_reg 290 in the pulse density modulator, is modulated by the density of the output of the first pulse density modulator 306, dim_out signal 308.

Referring back to FIG. 4, pulse stream generator 200 generally includes three primary blocks or functions, first pulse modulator 208, AND block 212, and second pulse modulator 216. One term of the multiplication, Term_2 204, is converted into pulse stream Term_2_mod 210 by first pulse modulator 208. The product of the two input terms is performed by AND block 212, which receives as inputs N-bit Term_1 202 and pulse stream Term_2 mod 210. The output of AND block 212 is rectangular wave P_result 214. Generally, the average over a sufficiently long interval of P_result 214 corresponds to the product of the 2 terms Term_1 202 and Term_2 204. The signal P_result 214 then is converted to output pulse stream 206 by second pulse modulator 216. An example using pulse density modulators is described below. As a first assumption, the variation (B_Term) rate of the two terms is:

$$B\_Term\_x < \frac{1}{2^n * Tclk} \qquad \text{Formula 1}$$

where
B_Term_x is the signal frequency band,
n is the number of bits of the modulator input, and
Tclk is the modulator clock period.

To complete a cycle, the pulse density modulator spends exactly $2^n*Tclk$ clock cycles. Therefore, to correctly obtain the pulse density, $2^n*Tclk$ clocks are needed. This assumption is valid for both input terms Term_1 and Term_2.

Figure 6:
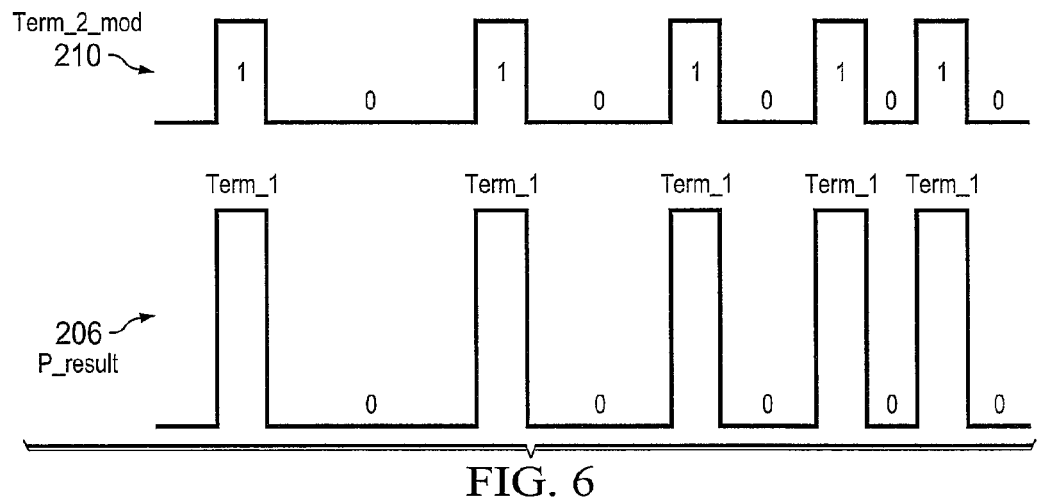
FIG. 6 is a timing diagram of the outputs of the logic AND block and one of the pulse modulators of FIG. 5.

If this assumption is valid, then the output bit stream of a pulse density modulator, with input Term_2, has the same number of '1's corresponding to Term_2 every $2^n*Tclk$ clock cycles. Hence, P_result is equal to Term_1 when Term_2_mod is '1' and is equal to '0' when Term_2_mod is '0', as shown in FIG. 6.

The mean value of P_result may be calculated by using the formula:

$$P\_mean = (1/N) * \sum_{j=0}^{N} P\_result(j*Tclk) \quad \text{Formula 2}$$

where $N=2^n$,
which corresponds to:

$$P\_mean = (1/N)^2 * Term\_1 * Term\_2 \quad \text{Formula 3.}$$

A specific example is provided below:
For n=3; →N=8,
Term_1=2,
and Term_2=3.
Using Formula 3:
P_mean=(2/8)*(3/8)=0.09375.
Using Formula 2:
The Term_2_mod pulse stream is, for example, "00100101",
Therefore P_result is "00200202", and
P_mean=(0+0+2+0+0+2+0+2)/8=0.09375.

Thus, in converting P_result with the second pulse density modulator, the output pulse stream is the same as the pulse density of the product Term_1*Term_2.

As another example, FIGS. 12, 13 and 14A-14B illustrate the behavior of a pulse stream generator having a pulse width modulator before the bitwise AND logic, and a pulse density modulator after the bitwise AND logic (PWM-PDM). As a further example, FIGS. 15 and 16 illustrate the behavior of a pulse stream generator having two pulse width modulators (PWM-PWM).

Figure 12:
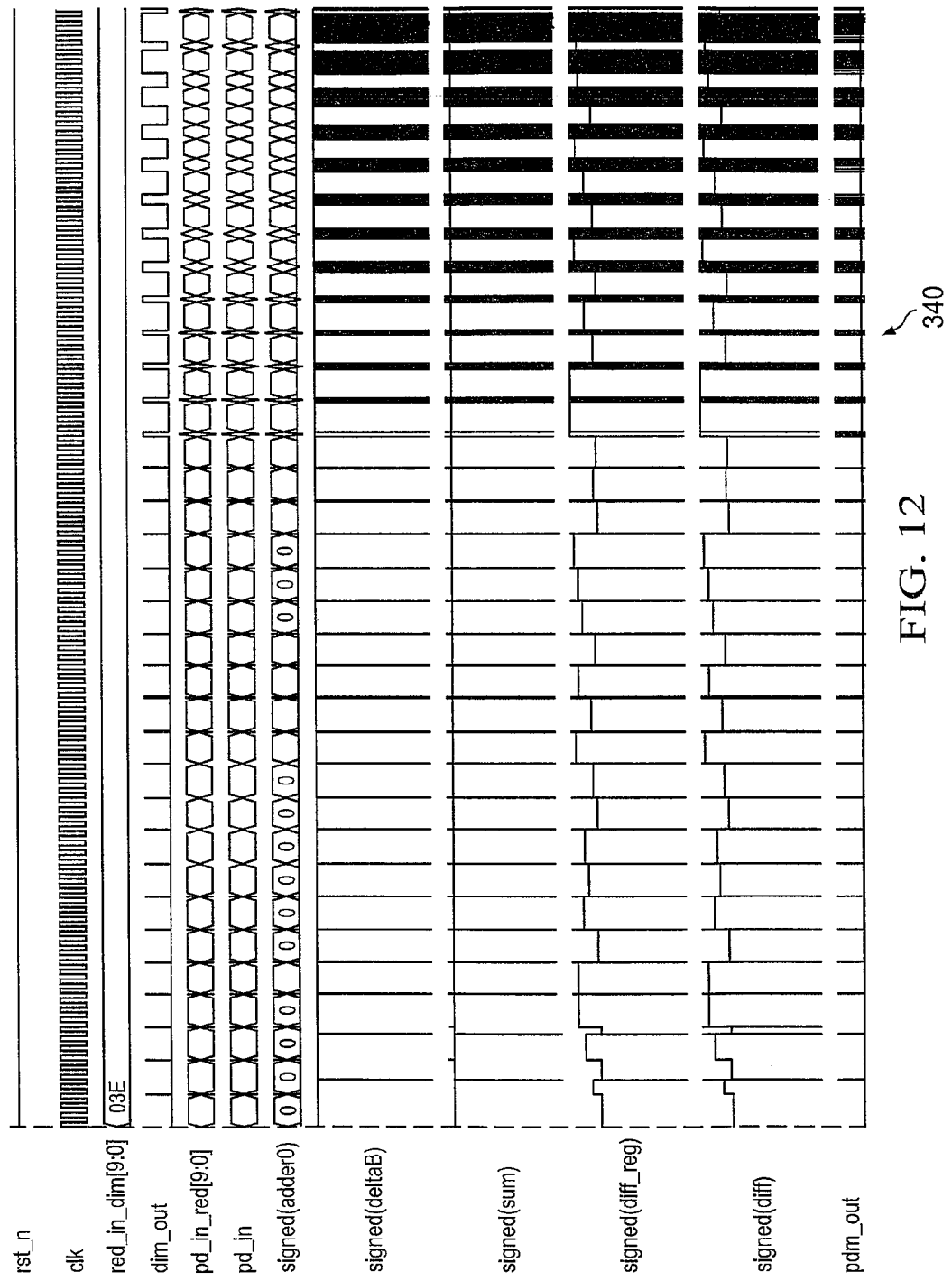
FIG. 12 is a timing diagram of a pulse stream generator having a pulse width modulator and a pulse density modulator.
Figure 13:
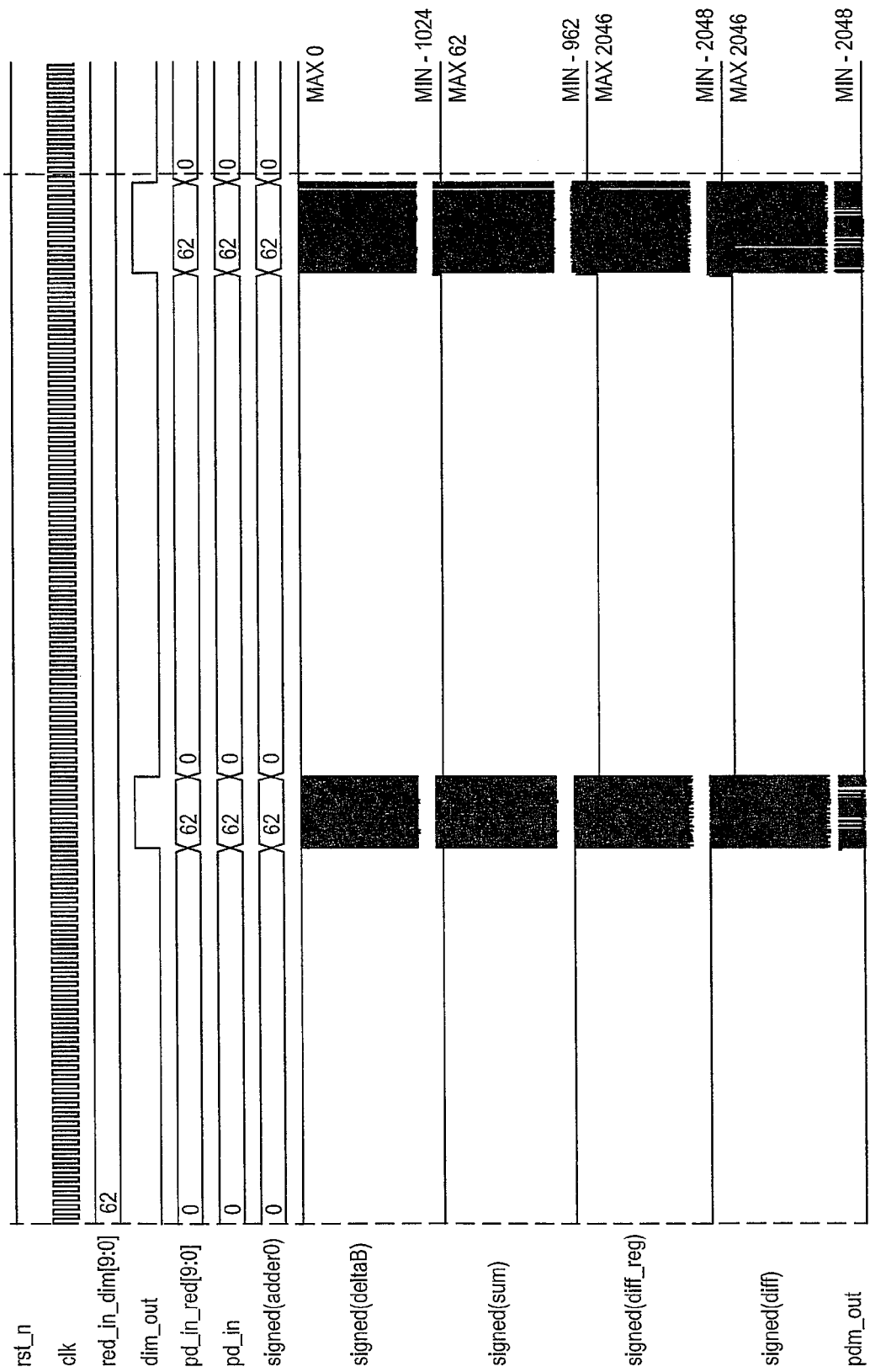
FIG. 13 is a timing diagram showing an expanded view of a portion of the timing diagram of FIG. 12.
Figure 14A:
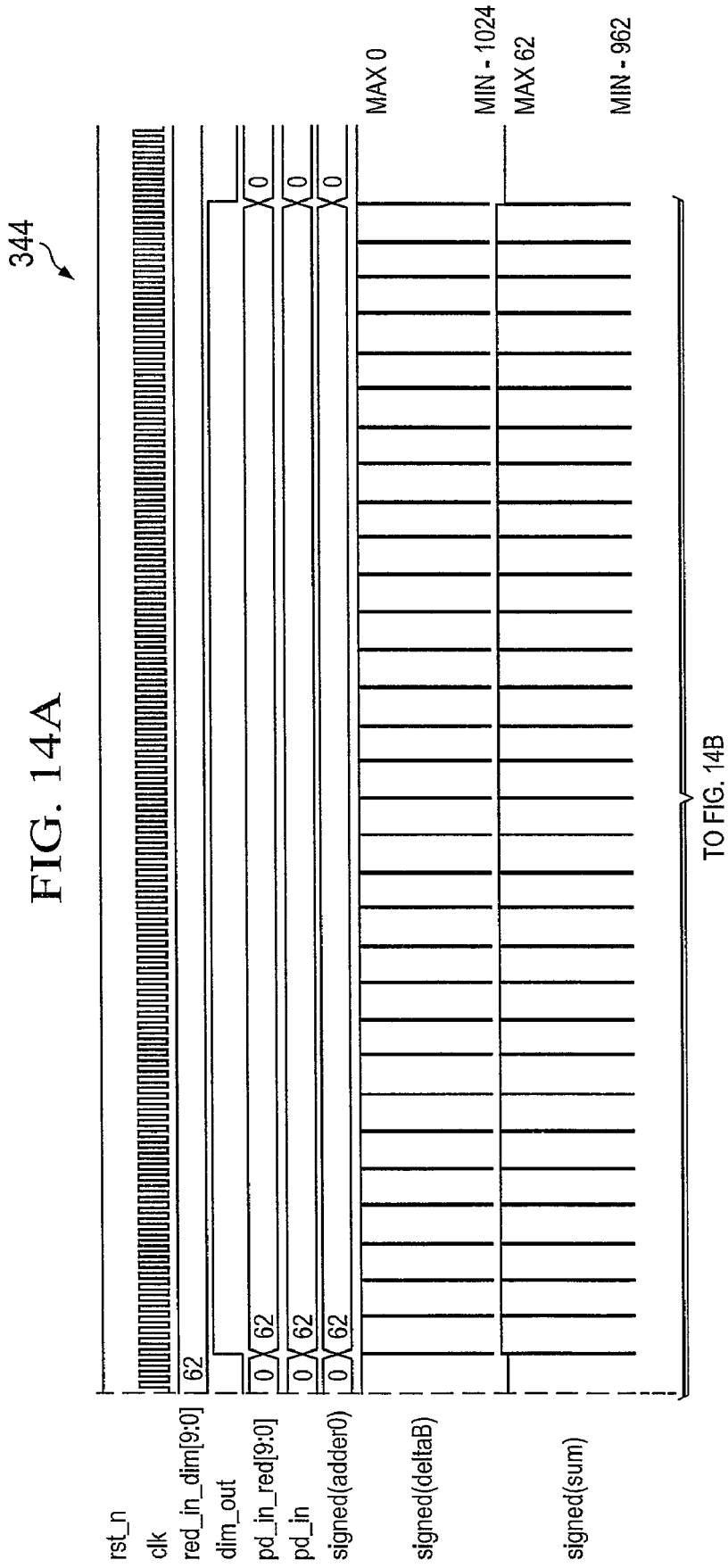

In the PWM-PDM embodiment timing shown in FIGS. 12, 13 and 14A-14B, timing chart 340 of FIG. 12 shows the general operation of the PWM-PDM system, while the timing chart of FIG. 13 is a zoomed timing chart 342 of a portion of timing chart 340, showing one of the duty cycles. Timing chart 344 in FIGS. 14A-14B is still further zoomed in on a portion of timing chart 342, showing the active portion of one of the duty cycles. As can be these timing charts, the PWM-PDM embodiment concentrates the PDM output pulses (pdm_out signal) only in the active portion of the PWM duty cycle (dim_out signal), leaving wide clean zones in the inactive portions of the PWM duty cycle. When the pdm_out signal is used to control an LED, the wide clean spaces generally are not visible to the eye. Generally, the dim resolution is lower for the PWM-PDM system than the resolution achieved by a comparable PDM-PDM system.

Figure 15:
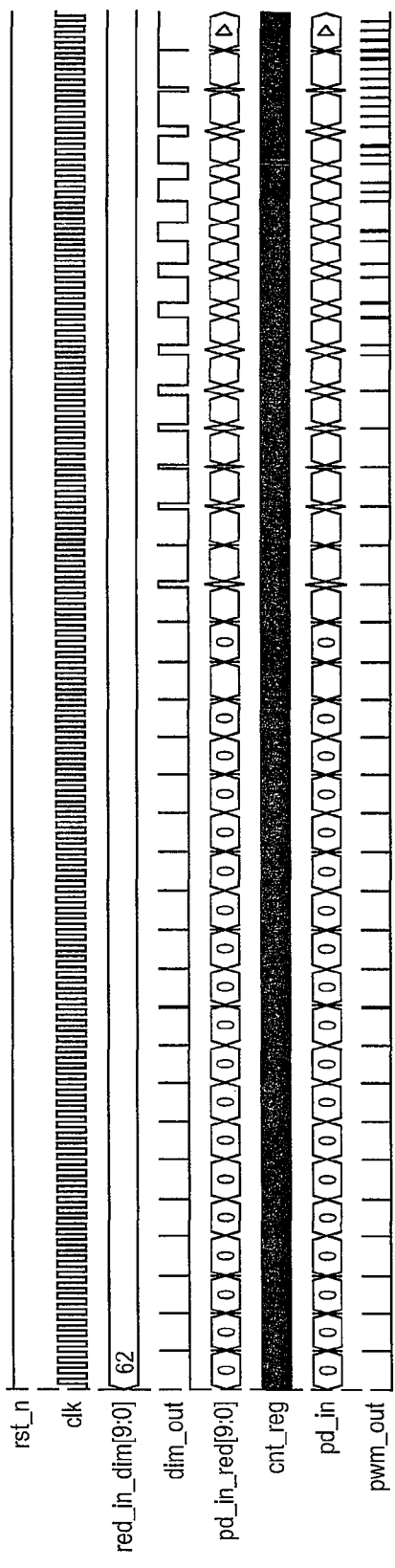
FIG. 15 is a timing diagram of a pulse stream generator having two pulse width modulators.
Figure 16:
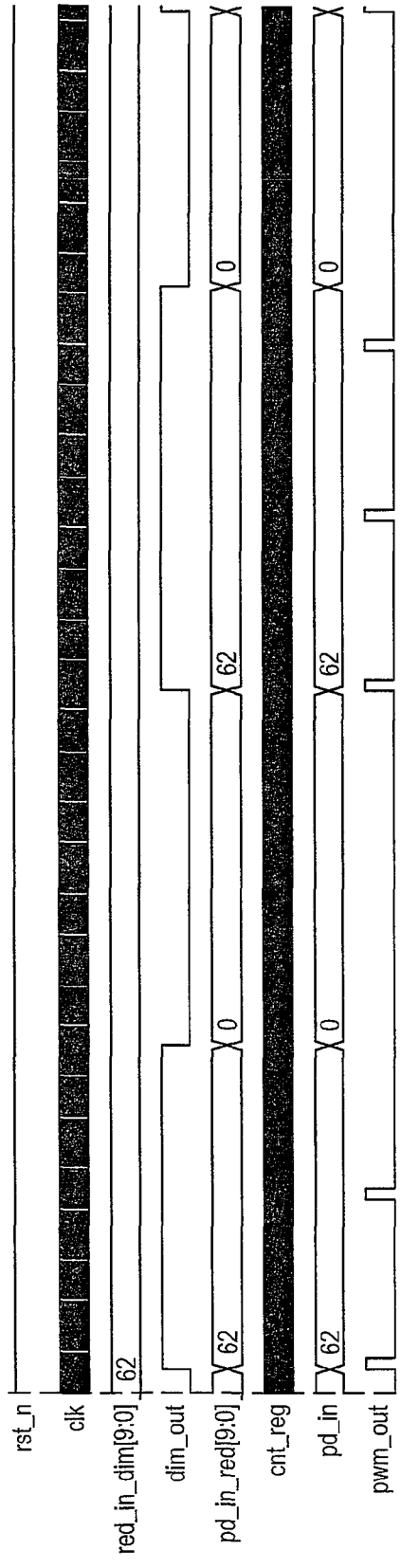
FIG. 16 is a timing diagram showing an expanded view of a portion of the timing diagram of FIG. 15.

In the PWM-PWM embodiment, shown in FIGS. 15 and 16, timing chart 350 of FIG. 15 shows the general operation of the PWM-PWM system, while the timing chart of FIG. 16 is a zoomed timing chart 352 of a portion of timing chart 350, showing several of the duty cycles. In the PWM-PWM system, the pulses also are concentrated in the active part of the duty cycle of the first PWM. Because the two PWMs have a common working frequency, there generally is a loss of resolution during the dimming action, between 0 and 100%, compared to the resolution obtained with a comparable PDM-PDM system.

Generally, the dim resolution of the PWM-PWM system is the lowest of the three types of systems. This generally is caused by the updating of the input and output of the PWM only after the entire range of the counter has been covered. The PDM, on the other hand, provides a structure that is more prompt in fitting the output to the input. Generally, for this reason, the PDM-PDM system may offer the best performance for dimming and driving an RGB LED.

In some pulse modulator systems, it is possible that the intervals between active pulses are so long that they may cause a discontinuous output stream in the transducer or actuator being controlled. The effect of the discontinuity may depend on the type and sensitivity of the final receiver of the signal. For example, in LED control, the discontinuity may cause flickering of the light output from the LED.

Previous methods of control include analog time-continuous driving, amplitude modulation, and increasing modulation rate, but each of these approaches has disadvantages. Disadvantages of analog techniques and amplitude modulation techniques with respect to digital techniques are well known. For example, analog generally is more complex to implement, more expensive, and is susceptible to heat, drift, and noise. Increasing the modulation rate generally results in higher system complexity and cost.

Embodiments described below generally prevent discontinuities in the output stream from occurring at a perceivable rate. For example, implemented in an LED control system, these embodiments may avoid flickering of the LED even when there are long intervals between active pulses. Any of these embodiments may be implemented together with the embodiments described herein above, for example at the second stage pulse modulator.

Figure 17:
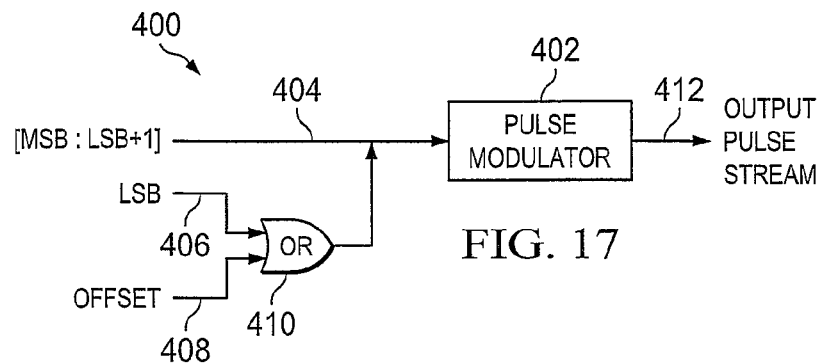
FIG. 17 is a block diagram of a pulse modulator having a 1-bit offset input.

One embodiment for avoiding perceivable output stream discontinuities is shown in FIG. 17. Pulse stream generator 400 generally uses a bare input offset to reduce perceivable discontinuities. In particular, instead of pulse modulator 402 directly receiving an N-bit input on which to perform pulse modulation, pulse modulator 402 only directly receives the N−1 most significant bits, LSB+1 to MSB, signal 404. The LSB 406 of the input signal is put through a logic OR 410 with an offset signal 408. Periodically adding a bit with offset signal 408 generally prevents an input to the pulse modulator 402 from being zero for an extended period. The 1-LSB offset added to the input effectively controls the minimum output frequency of the output pulse stream 412, even if the input signal has a long inactive period.

Figure 18:
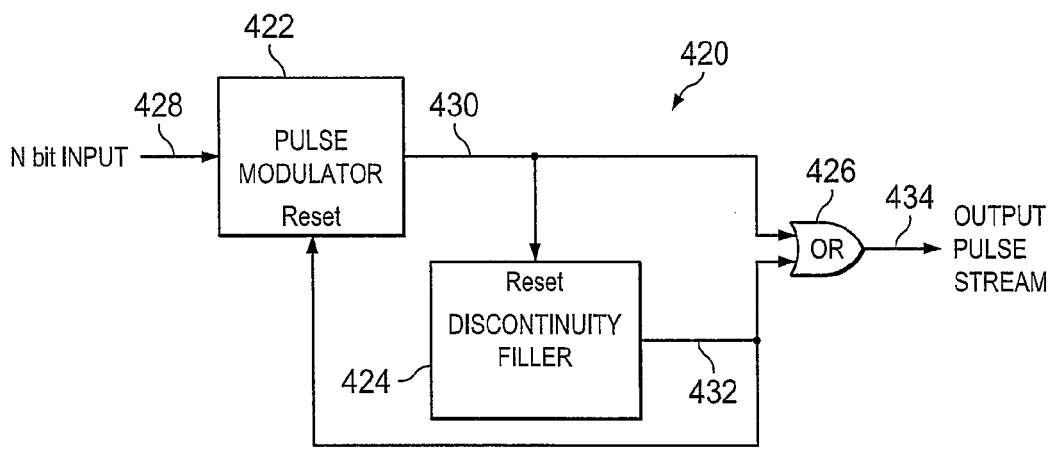
FIG. 18 is a block diagram of a pulse stream generator having a discontinuity filler.

FIG. 18 illustrates another embodiment of a pulse stream generator 420. In this embodiment, pulse modulator 422 generates pulses at rate based on the N-bit input 428. The first pulse stream 430 output from pulse modulator 422 is monitored by discontinuity filler 424. When discontinuity filler 424 detects that a certain period of time has elapsed since the previous pulse, discontinuity filler 424 generates a filler pulse 432 for injection into the output pulse stream. Filler pulse 432 OR'd with the first pulse stream 430 by logic OR 426 such that an output pulse is outputted as part of output pulse stream 434 when no pulse has been generated by pulse modulator 422.

Filler pulse 432 additionally resets pulse modulator 422 at the same time. In this way, the receiver of the output pulse stream 426 (e.g., an LED or other transducer) does not perceive the separation between two active pulses as a momentary turn off. In this manner, the resulting limitation in terms of input signal corresponds to less than 1-LSB inaccuracy.

Alternatively, in another embodiment, pulses from the discontinuity filler 424 may be mixed with the pulses from the pulse modulator by logic OR 426, as in FIG. 18, but without resetting the pulse modulator. This is similar to adding an input offset as performed by the embodiment of FIG. 17, but still provides the capability of having less than 1-LSB inaccuracy.

Figure 19:
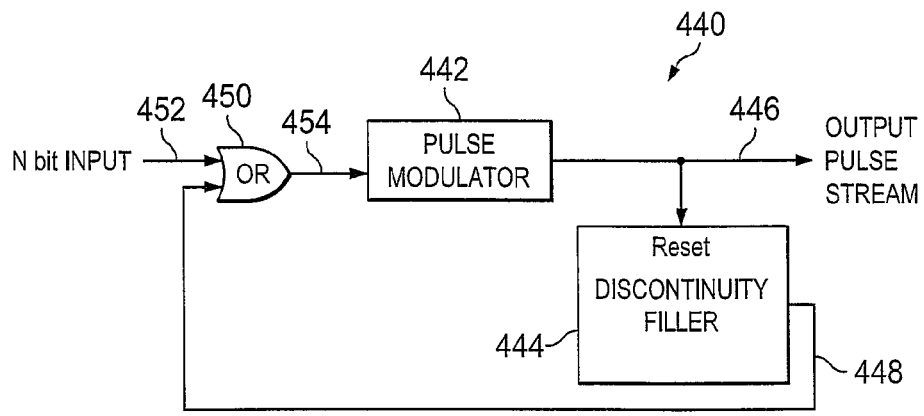
FIG. 19 is a block diagram of a pulse stream generator having a discontinuity filler.

FIG. 19 illustrates yet another embodiment of a pulse stream generator 440. In this embodiment, the modulation is on the density of pulses. Pulse modulator 442 normally generates pulses at rate based on the N-bit input 452. The output pulse stream 446 output from pulse modulator 442 is monitored by discontinuity filler 444. When discontinuity filler 444 detects that a certain period of time has elapsed since the previous pulse (that is, when an output stream discontinuity is detected), discontinuity filler 444 injects a one-time $2^{MSB}-1$ value into the input of pulse modulator 442. Alternatively, any other non-zero value between 1 and $2^{MSB}-1$, such as 1, $2^{MSB/2}-1$, and the like, may be injected into the input of pulse modulator 442.

Discontinuity filler 444 generates the injection signal 448 upon detection of a discontinuity in output pulse stream 446. The injection signal 448 is fed into a logic OR 450, which also receives the N-bit Input signal 452. The output 454 of the logic OR 450 provides the input to the pulse modulator 442. Even when the N-bit input signal 452 is null, injection signal 448 is fed into the input of pulse modulator 442. Based on the injection from the discontinuity filler 448, pulse modulator 442 generates an output pulse stream 446 without a discontinuity.

Figures 20, 21:
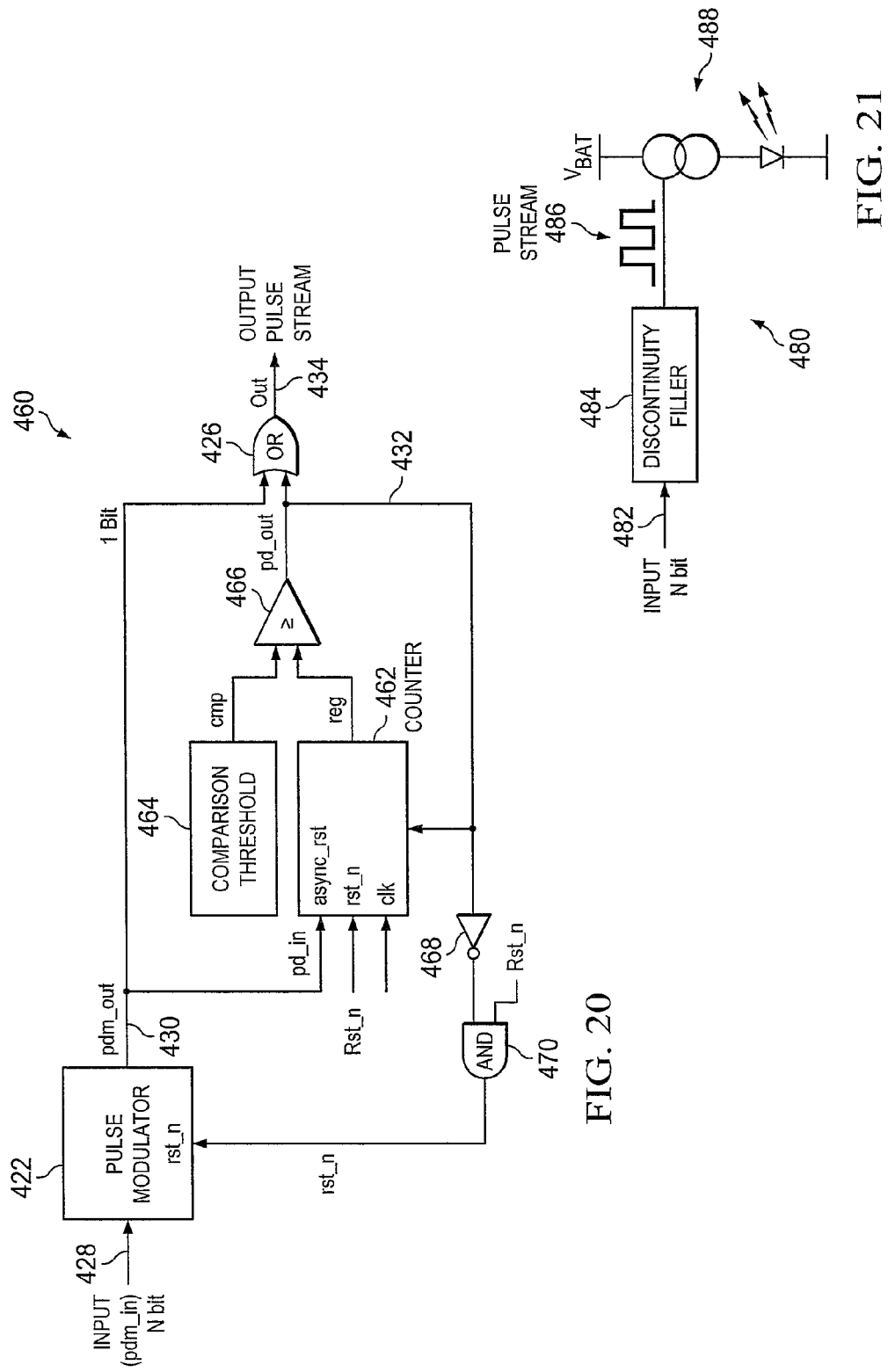
FIG. 20 is a block diagram of a pulse stream generator showing components of the discontinuity filler.
FIG. 21 is a block diagram of a pulse stream generator LED control system.

FIG. 20 illustrates a pulse stream generator 460 having a specific implementation of the discontinuity filler 424 of FIG. 18. The discontinuity filler includes counter 462, comparison threshold memory 464 and comparator 466. Counter 462 receives pulse generator 422 pulse stream pdm_out signal 430. Comparison threshold memory 464 may be a register holding a numeric value corresponding to the maximum clock pulses count (maximum time) allowed between two consecutive pulses. Comparator 466 compares the two values, and when the counter 462 reaches the threshold value, comparator 466 generates an idle output pulse that is inserted into the output pulse stream 434 in order to interrupt the inactive status of the output pulse stream 434. This idle pulse is an injected value and does not correspond to an actual input value from input 428. In addition, the pulse from comparator 466 synchronously resets counter 462 so that a new timing interval count starts immediately. Furthermore, the pulse from comparator 466 resets the pulse modulator 422 so that output pulse stream generation is restarted. The idle pulse from the comparator 466 is sent through a logic NOT 468 and AND'd with a reset signal by logic AND 470 before being fed into the reset input of the pulse modulator 422. Generally, resetting the pulse modulator prevents a pulse modulator output pulse from occurring immediately after the idle pulse, so that peaks in the transducer are avoided.

During a counting operation, counter 462 is asynchronously reset by the modulator output pulses such that the discontinuity filler has a frequency-based enable input. That is, when the frequency of the pulse modulator output pulse stream is sufficiently high, the counter value does not reach the threshold value, and idle pulses are not generated, and the final output pulse stream is not modified.

FIG. 21 illustrates an application of a pulse stream generator 480 having a discontinuity filler for LED control and dimming. Discontinuity filler 484 receives an N-bit input 482 and generates an internal pulse stream. If a discontinuity is detected, discontinuity filler 484 generates an idle pulse to avoid the discontinuity in its output. The OR output of the internal pulse stream and the idle pulse is pulse stream 486, which is used to control LED 488.

VHDL implementations of different aspects of the discontinuity filler are provided below. In the code, various variables and parameters have the following definitions:

"pdm_out" is the pulse stream provided by the pulse density modulator, and is connected to "pd_in", which is the synchronous reset of the counter.

"reg" is the number of periods of "clk_50k" spent from the last "pd_in" pulse.

"cmp" is the maximum number of periods of "clk_50k" between two Out pulses.

"pd_out" is the result of the comparator and is '1' only when the maximum time between two pulses is reached.

Rst_n is the reset, active low.

"rst_n" is a PDM feedback reset, equal to ((NOT (pd_out)) AND Rst_n). It is active low if Rst_n='0' or if "pd_out"='1'.

"pdm_in" is the input of the PDM.

The logic OR between the pdm_out (pulse modulator output) and the pd_out (comparator output) is the final output pulse stream, Out, which may be fed directly the LED driver stage.

The code below provides a model of the comparison threshold register, counter and comparator logic ($\geqq$) in the discontinuity filler.

```
library ieee;
use ieee.std_logic_1164.all;
use ieee.std_logic_unsigned.all;
use ieee.std_logic_arith.all;
entity w_dog is
    port(
        rst_n         in    std_logic;        --reset
        clk_50k:      in    std_logic;        --clock
        pd_in:        in    std_logic;        --output of the pulse modulator
        pd_out:             out std_logic     --output of the AntiFlickering
    );
end w_dog;
architecture behavioral of w_dog is
signal reg:      std_logic_vector(10 downto 0);    -- counter register
signal cmp:      std_logic_vector(10 downto 0);    -- comparison register
begin
cmp <= "10110010100"; --35Hz                        --output pulse stream minimum frequency
```

```
process(clk_50k, rst_n)
    begin
        if (rst_n = '0') then
            reg <= "00000000000";              --reset
        else if (clk_50k='1' and clk_50k'event) then    --clock's rising edge
            if(pd_in = '1') then
                reg <= "00000000000"; --when modulator's output ='1'
                                                    --reset the counter register
                pd_out <= '0';                  --output antiflickering =' 0'.
            elsif (reg >= cmp) then             -- maximum time allowed is reached.
                reg <= "00000000000"; -- counter register restart to count.
                pd_out <= '1';                  -- the antiFl provides the Out pulse
            else
                reg <= reg + 1;                 -- else the counter continues to count
                pd_out <= '0';                  -- antiFl output is '0'
            end if;
        end if;
    end if;
end process;
end behavioral;
```

The code below provides an implementation of the first order sigma-delta pulse density modulator.

```
        library ieee;
use ieee.std_logic_1164.all;
use ieee.std_logic_unsigned.all;
use ieee.std_logic_arith.all;
entity pdm is
    port(
        rst_n:      in      std_logic;              --rst or (not(pd_out))
        clk:        in      std_logic;
        pdm_in:     in      std_logic_vector(9 downto 0);--input register
        pdm_out:    out     std_logic                -- equal to w_dog 's pd_in
    );
end pdm;
architecture behavioral of pdm is
signal sum:         std_logic_vector(11 downto 0);
signal diff:        std_logic_vector(11 downto 0);
signal diff_reg:    std_logic_vector(11 downto 0);
signal deltaB:      std_logic_vector(11 downto 0);
signal adder0:      std_logic_vector(11 downto 0);
begin
deltaB <= diff_reg(11) & diff_reg(11) & "0000000000";    -- feedback value
adder0(11 downto 0) <= "00" & pdm_in(9 downto 0);        --shifted input
sum <= adder0 + deltaB;                                  --internal signal
diff <= sum + diff_reg;
process(clk, rst_n)
    begin if(rst_n ='0') then       --if reset ='0' or pd_out = '1' reset of the pdm
            diff_reg <= "100000000000";
            pdm_out <= '0';
        else if (clk='1' and clk'event) then
            diff_reg <= diff;
            pdm_out <= diff_reg(11); --pdm_out = sign(diff_reg)
        end if;
end process;
end behavioral;
```

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A pulse stream generator comprising:
    a first pulse modulator having a first multi-bit term input, and having a first one-bit pulse stream output;
    a logic AND block having a first input coupled to the first one-bit pulse stream output of the first pulse modulator, having a second multi-bit term input, and having a multi-bit AND output; and
    a second pulse modulator having an input coupled to the multi-bit AND output, and having a second one-bit output pulse stream output representing a product of the first and second multi-bit term inputs.

2. The pulse stream generator of claim 1, wherein each of the pulse modulators is a pulse density modulator.

3. The pulse stream generator of claim 2, wherein each pulse density modulator is a first order delta-sigma pulse density modulator.

4. The pulse stream generator of claim 1, wherein the logic AND block comprises a bitwise logic AND for each bit in the second multi-bit term input.

5. The pulse stream generator of claim 1, further comprising an LED driver having an input coupled to the one-bit output pulse stream output, wherein the first multi-bit input term represents a dimming level for the LED, and wherein the second multi-bit input term represents a color intensity for the LED.

6. A method of generating an output pulse stream, the method comprising:
   first pulse modulating a first multi-bit input term to generate a first one-bit pulse stream;
   using a bitwise logic AND to combine the first one-bit pulse stream and a second multi-bit term, thereby generating a multi-bit AND output; and
   second pulse modulating the multi-bit AND output to generate a one-bit output pulse stream representing a product of the first and second multi-bit input terms.

7. The method of claim 6, wherein the first and second pulse modulations are pulse density modulations.

8. The method of claim 6, further comprising controlling a light emitting diode (LED) with the one-bit output pulse stream.

9. The method of claim 8, wherein the first multi-bit input term represents a dimming level for the LED, and the second multi-bit input term represents a color intensity for the LED.

10. The method of claim 9, further comprising generating three separate one-bit output pulse streams, one for each of red, green and blue channels, wherein the first one-bit pulse stream is shared by the channels, and wherein each channel performs a separate logic AND and a separate second pulse modulating based on separate second multi-bit input terms for each color.

11. A pulse stream generator comprising:
   a pulse modulator having a first multi-bit input and having a first one-bit pulse stream output;
   a logic OR coupled to the pulse modulator; and
   a discontinuity filler having a count reset input coupled to the first one-bit pulse stream output of the pulse modulator, and having a filler output coupled to a first input of the logic OR.

12. The pulse stream generator of claim 11, wherein the first one-bit pulse stream output of the pulse modulator is coupled to a second input of the logic OR, and wherein the logic OR has a second one-bit pulse stream output.

13. The pulse stream generator of claim 12, wherein the filler output of the discontinuity filler is further coupled to a first reset input of the pulse modulator.

14. The pulse stream generator of claim 11, wherein the logic OR has a second input coupled to a source multi-bit input, and wherein the logic OR has an output coupled to the first multi-bit input of the pulse modulator.

15. The pulse stream generator of claim 11, wherein the discontinuity filler further comprises:
   a counter having the count reset input and having a idle time count output;
   a comparison threshold memory containing a maximum idle time count threshold; and
   a comparator for comparing the idle time count output with the maximum idle time count, the comparator having the filler output as a comparator output indicating whether the idle time count is equal to or greater than the maximum idle time count.

16. A method of generating an output pulse stream, the method comprising:
   pulse modulating a first multi-bit input to generate a first one-bit pulse stream;
   monitoring the first one-bit pulse stream for idle periods; and
   if an idle period is detected to be equal to or greater than a discontinuity threshold, injecting a filler output into a one-bit output pulse stream.

17. The method of claim 16, wherein the injecting the filler output comprises injecting a filler pulse directly into the one-bit output pulse stream, wherein the one-bit output pulse stream comprises the first one-bit pulse stream combined with the filler pulse.

18. The method of claim 17, further comprising resetting the pulse modulator with the filler output when the idle period is detected to be equal to or greater than the discontinuity threshold.

19. The method of claim 16, wherein the output pulse stream is the first one-bit pulse stream, and wherein the injecting the filler output comprises adding a non-zero value to the multi-bit input prior to the pulse modulating.

20. The method of claim 16, further comprising driving an LED with the one-bit output pulse stream.

* * * * *